(12) United States Patent
De Jong

(10) Patent No.: US 8,514,370 B2
(45) Date of Patent: *Aug. 20, 2013

(54) SUBSTRATE SUPPORT STRUCTURE, CLAMP PREPARATION UNIT, AND LITHOGRAPHY SYSTEM

(75) Inventor: Hendrik Jan De Jong, The Hague (NL)

(73) Assignee: Mapper Lithography IP B.V., Delft (NL)

( * ) Notice: Subject to any disclaimer, the term of this patent is extended or adjusted under 35 U.S.C. 154(b) by 99 days.

This patent is subject to a terminal disclaimer.

(21) Appl. No.: 13/030,217

(22) Filed: Feb. 18, 2011

(65) Prior Publication Data

US 2012/0043438 A1 Feb. 23, 2012

Related U.S. Application Data

(60) Provisional application No. 61/306,199, filed on Feb. 19, 2010, provisional application No. 61/310,303, filed on Mar. 4, 2010.

(51) Int. Cl.
*G03B 27/42* (2006.01)
(52) U.S. Cl.
USPC .............................................. 355/53; 355/72
(58) Field of Classification Search
USPC .................. 269/20; 355/53, 72, 69; 361/234
See application file for complete search history.

(56) References Cited

U.S. PATENT DOCUMENTS

| | | | |
|---|---|---|---|
| 4,918,870 A * | 4/1990 | Torbert et al. | 451/287 |
| 2005/0122505 A1 | 6/2005 | Miyajima | |
| 2005/0259236 A1 | 11/2005 | Straaijer | |
| 2007/0132979 A1 * | 6/2007 | Lof et al. | 355/69 |
| 2010/0265486 A1 * | 10/2010 | De Jong et al. | 355/72 |

FOREIGN PATENT DOCUMENTS

| | | |
|---|---|---|
| EP | 0511928 A1 | 11/1992 |
| EP | 1732105 A2 | 12/2006 |
| GB | 2469113 A * | 10/2010 |
| WO | 2008013443 A2 | 1/2008 |
| WO | 2009011574 A1 | 1/2009 |

OTHER PUBLICATIONS

International Search report PCT/EP2011/052461 issued by the EPO.

* cited by examiner

*Primary Examiner* — Gwendolyn Baxter
(74) *Attorney, Agent, or Firm* — Hoyng Monegier LLP; David P. Owen; Coraline J. Haitjema

(57) ABSTRACT

A substrate support structure for clamping a substrate on a surface by means of a capillary layer of a liquid. The surface has an outer edge and includes one or more substrate supporting elements for receiving the substrate to be clamped, wherein the one or more substrate supporting elements are arranged to provide support for the substrate at a plurality of support locations. The substrate support structure further includes a sealing structure circumscribing the surface and having a top surface or edge forming a sealing rim. A distance between the outer edge of the surface and an outermost of the support locations is greater than a distance between the outer edge and the sealing rim.

21 Claims, 11 Drawing Sheets

FIG. 10A        FIG. 10B

SUBSTRATE SUPPORT STRUCTURE, CLAMP PREPARATION UNIT, AND LITHOGRAPHY SYSTEM

BACKGROUND OF THE INVENTION

1. Field of the Invention

The present invention relates to a substrate support structure for clamping a substrate on a surface thereof.

2. Description of the Related Art

Clamping of a substrate, for example a wafer, onto a surface of a substrate support structure, for example a wafer table, is well known in the semiconductor industry, and in particular in lithography systems. In such lithography systems, the clamped substrate is patterned by exposure to incident photons or charged particles such as ions or electrons. The clamping permits the realization of high precision patterning of a target portion of the substrate surface.

One method of clamping is by sucking away air between the substrate and the substrate support structure, i.e. by creating a vacuum in between them. However, if the clamped substrate is to be processed in a vacuum environment, this method will not be effective. Various other solutions exist for clamping a substrate in a vacuum environment, for example by means of electromechanical clamping. However, this solution is not suitable for use with charged particle lithography due to the undesirable influence of the electric fields used for clamping on the beams of charged particles.

Another method of clamping which avoids the above problems is by using a liquid layer arranged to induce a capillary force such that the substrate is clamped on a surface of a substrate support structure. Adhesion of the liquid to the surfaces of the substrate on the one hand and the substrate support structure on the other hand creates a circumferentially extending liquid surface, concavely extending between the two surfaces. The so-formed concave liquid surface tends to maintain its shape, even if forces are applied to remove the substrate from the substrate support structure surface. The liquid layer may further serve the purpose of enhancing the thermal contact between the substrate and the substrate support structure surface to enable the substrate to withstand higher heat loads without being subject to excessive contraction or expansion.

However, clamping using a liquid clamping layer suffers from several drawbacks. Evaporation of the clamping liquid layer results in deterioration of the clamping force over time, which limits the useful lifetime of the clamp. Leakage of vapor from the liquid layer is also a problem for many applications, such as a lithography process in which the clamped substrate is introduced into a vacuum environment and water molecules from vapor leaking into the vacuum chamber are contaminants detrimental to the lithography process. Condensation of vapor from the clamping liquid may also pose a problem, reducing the lifetime of the clamp.

BRIEF SUMMARY OF THE INVENTION

It is an object of the invention to provide a means for clamping a substrate which addresses problems encountered in previous methods. To this end, the invention provides a substrate support structure for clamping a substrate on a surface by means of a capillary layer of a liquid.

The surface has an outer edge and includes one or more substrate supporting elements for receiving the substrate to be clamped, wherein the one or more substrate supporting elements are arranged to provide support for the substrate at a plurality of support locations. The substrate support structure further includes a sealing structure circumscribing the surface and having a top surface or edge forming a sealing rim. A distance between the outer edge of the surface and an outermost of the support locations is greater than a distance between the outer edge and the sealing rim.

The substrate support structure may be designed so that the distance between the sealing rim and the outermost support location is greater than a maximum distance between adjacent support locations. In some embodiments, the distance between the outer edge of the surface and the outermost support location may be greater than or equal to twice the distance between the outer edge and the sealing rim. In some embodiments, the distance between the sealing rim and the outermost support location is greater than or equal to twice the maximum distance between adjacent support locations. In some embodiments, the distance between the outer edge of the surface and the outermost support location is greater than or equal to twice the maximum distance between adjacent support locations. The sealing rim may be arranged substantially level with a top of the substrate supporting elements.

The one or more substrate supporting elements may provide support for the substrate at a plurality of support locations arranged in a regular pattern with a mutual pitch, and the distance between the sealing rim and the support locations nearest to the sealing rim may be arranged so that it exceeds this pitch.

The receiving surface of the substrate support structure may further comprise portions with different capillary potential for inducing, during clamping, a predetermined capillary flow within the liquid clamping layer. The portions with different capillary potential may be provided at least in part at the periphery of the receiving surface of the substrate support structure. In some embodiments the predetermined capillary flow within the liquid clamping layer may be in a direction towards the periphery of the liquid clamping layer, and in some embodiments the predetermined capillary flow within the liquid clamping layer may occur at least in part within one or more channels in the surface of the substrate support structure.

The portions with different capillary potential may have different height levels and/or different affinity for the clamping liquid and/or differing surface treatment or surface material or surface coating, to provide a difference in capillary potential. The surface of the substrate support structure may comprise a portion with a lower capillary potential at the perimeter of the substrate support structure surface at one or more predetermined locations while the majority of the perimeter has a higher capillary potential.

At least a part of the surface portion with a lower capillary potential may take the form of one or more channels, and the one or more channels may comprise one or more curved portions. In some embodiments at least a part of the one or more channels takes the form of a spiral, and in some embodiments at least a part of the one or more channels has a serpentine form. The surface area of the one or more channels may be arranged to cover less than 25% of the substrate support structure surface. In some embodiments the surface area of the one or more channels is homogeneously spread over the surface of the substrate support structure.

A moat may be provided around the receiving surface, the moat comprising a higher stepped portion at the perimeter of the surface. A height difference between a top surface of the substrate supporting elements and the stepped portion of the moat may be greater than or equal to twice the height of the substrate supporting elements.

The receiving surface may also be provided with elevated structures for forming a plurality of compartments, and the height of the elevated structures may be less than the height of the substrate supporting elements. In some embodiments the height difference between the elevated structures and the substrate supporting elements is at least 1.5 microns.

The substrate support structure may also include a liquid reservoir for storing reservoir liquid, and a vapor transfer system connecting the reservoir with the receiving surface of the substrate support structure for providing vapor from the reservoir liquid to the capillary layer. The reservoir may extend underneath the receiving surface, and the reservoir may comprise a cavity having a greater portion located underneath the receiving surface and a lesser portion extending out from a circumference of the receiving surface. The volume for storage of the reservoir liquid in the reservoir may be greater than a volume of the capillary layer of liquid. In some embodiments the reservoir is detachable from the receiving surface.

The substrate support structure may also include a liquid removal system for removing liquid circumferential to the receiving surface. The liquid removal system may include a gas distribution system. The gas distribution system may comprise at least one gas inlet for providing gas, and at least one gas outlet for removing gas. The gas distribution system may have a plurality of gas inlets and outlets at equidistant positions with respect to each other.

In another aspect, the invention relates to a combination of a substrate support structure and a substrate clamped on a surface of the substrate support structure by means of a capillary layer of a liquid, the surface comprising one or more substrate supporting elements for receiving the substrate and arranged to provide support for the substrate at one or more support locations. The substrate support structure further comprises a sealing structure around the surface and having a top surface or edge forming a sealing rim. A distance between the sealing rim and an outermost one of the support locations is sufficiently large so that, during clamping of the substrate, the substrate bends downwards to reduce or eliminate a gap between the sealing rim and a bottom surface of the substrate.

During clamping of the substrate, the gap may be reduced so that the bottom surface of the substrate touches the sealing rim. In some embodiments the sealing rim is substantially level with a top of the substrate supporting elements. The combination may be arranged so that the distance between the sealing rim and the outermost support location is greater than or equal to twice the maximum distance between adjacent support locations. In some embodiments the distance between the periphery of the capillary liquid layer and the outermost support location is greater than the distance between the periphery of the capillary liquid layer and the sealing rim.

The receiving surface may further comprises portions with different capillary potential for inducing, during clamping, a predetermined capillary flow within the liquid clamping layer. In some embodiments the predetermined capillary flow within the liquid clamping layer is in a direction towards the periphery of the liquid clamping layer, and in some embodiments the predetermined capillary flow within the liquid clamping layer occurs at least in part within one or more channels in the surface of the substrate support structure.

It will be evident that the presently invented principle may be set into practice in various ways.

BRIEF DESCRIPTION OF THE DRAWINGS

Various aspects of the invention will be further explained with reference to embodiments shown in the drawings wherein:

FIGS. 10A-10C are top views of the substrate support structure of FIG. 9 further schematically illustrating the concept of reclamping.

DESCRIPTION OF ILLUSTRATIVE EMBODIMENTS

The following is a description of various embodiments of the invention, given by way of example only and with reference to the drawings.

Figure 1:
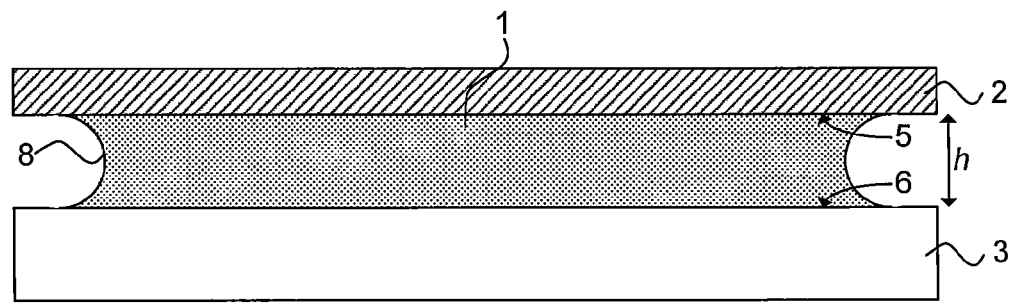
FIG. 1 is a sectional view schematically illustrating a clamping layer between two substantially flat structures.

FIG. 1 is a sectional view schematically illustrating a layer 1 of a liquid, between a first substrate 2, e.g. a wafer, and a second substrate 3, e.g. a substrate support structure like a wafer table. A suitable liquid for use in applications related to lithographic processing is water. The arrangement comprising a first substrate 2 and a second substrate 3 clamped together by means of a liquid layer 1, further referred to as clamping layer, in a way as shown in FIG. 1 will hereafter be referred to as a "clamp".

Because the thickness of the clamping layer is generally very small, and in such cases capillary forces are of importance, the clamping layer may also be referred to as capillary layer. The first and second substrates 2, 3 have a substantially flat surface 5, 6 respectively. The nominal distance between the opposing surfaces 5, 6 of the first and second substrates 2, 3 is given by height h. The clamping layer 1 has an outer liquid surface 8, also referred to as meniscus, which is generally concavely shaped due to adhesive connection of the liquid to the first substrate 2 and the second substrate 3. In case water is used as a clamping liquid, Van der Waals forces arising from the dipolar arrangement of the $H_2O$-molecule cause molecules to adhere to each other (surface tension) and to other surfaces (adhesion).

The concaveness of the outer liquid surface 8, also referred to as meniscus curvature, depends on the contact angle between the outer liquid surface 8 and the surface 5 of the first substrate 2, and on the contact angle between the outer liquid surface 8 and the surface 6 of the second substrate 3. The respective contact angles depend on the liquid used in the clamping layer 1 as well as on the material properties of the two substrates 2, 3. Furthermore, the meniscus curvature provides a pressure difference across the outer liquid surface 8. A higher meniscus curvature, i.e. a more concave outer surface, provides a higher pressure difference. More details with respect to a clamping layer holding together two structures with substantially flat opposing surface is provided in international patent application WO2009/011574, which is incorporated herein in its entirety.

Figure 2A:
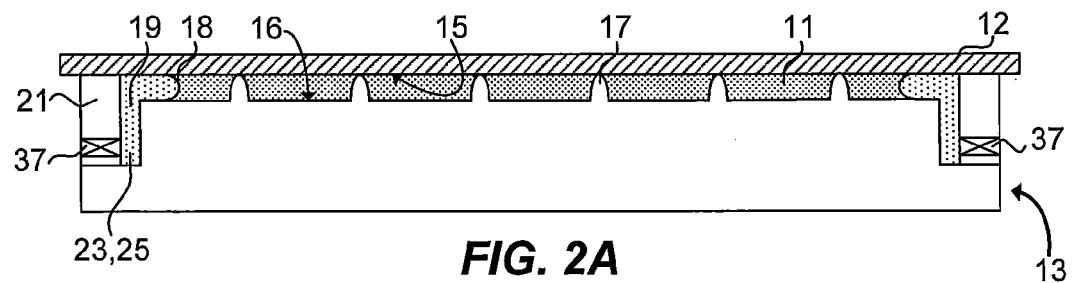
FIG. 2A is a sectional view of a substrate support structure suitable for clamping a substrate by means of a clamping layer.
Figure 2B:
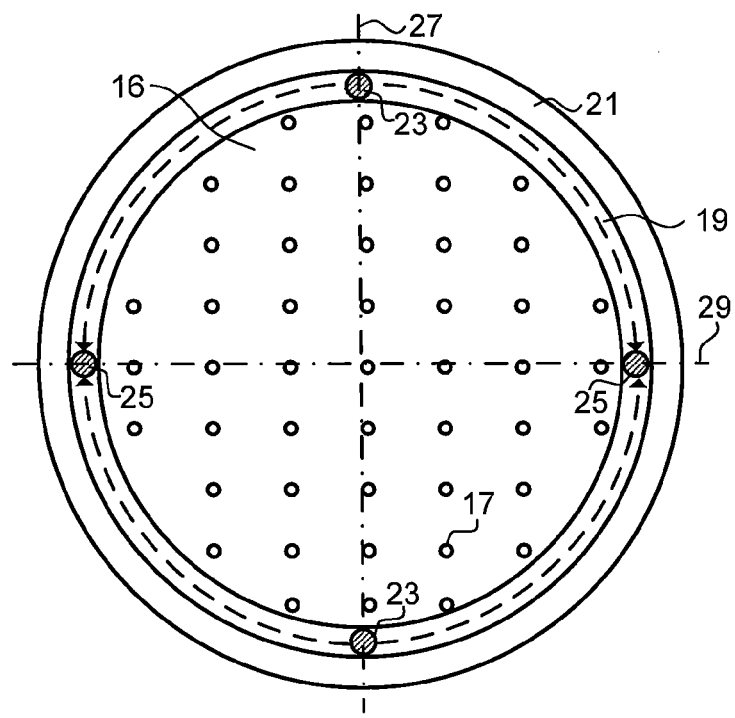
FIG. 2B is a top view of the substrate support structure of FIG. 2A.

FIGS. 2A and 2B schematically show a sectional view and a top view of a substrate support structure 13 suitable for clamping a substrate 12 by means of a clamping layer 11 in a way as described with reference to FIG. 1. The substrate support structure 13 comprises a surface 16 provided with one or more substrate supporting elements 17.

The substrate supporting elements 17 are arranged to define and maintain a distance between the substrate 12 and the substrate support structure 13. They may take the form of burls as shown in FIGS. 2A, 2B, or one or more ridges. Additionally or alternatively, a plurality of spacers, e.g. glass grains, $SiO_2$ grains or the like may be dispersed uniformly over the surface 16 to serve as substrate supporting elements.

The substrate supporting elements 17 may be arranged to reduce deformation of the substrate caused by the clamping force exerted by the clamping layer 11. Their presence may for example reduce the occurrence of substrate bow. Furthermore, the presence of substrate supporting elements 17 may reduce the influence of contamination by particles on the backside 15 of the substrate 12.

The pitch of the substrate supporting elements 17 may be based on the requirements set for the maximum substrate deflection caused by the clamping force of the clamping layer. The contact surface per substrate supporting element 17 is such that it is sufficient to withstand deformation and/or destruction under the applied clamping pressure. Preferably, edges of a contact element are rounded to reduce the possibility of particle contamination, e.g. during cleaning operations. A typical value for the diameter of a burl with a circular contact area would be in the range of 10-500 microns, for example 200 microns. A typical value for the pitch of a plurality of burls would be in the range of 1-5 mm, for example 3 mm.

The nominal height of the substrate supporting elements 17 determines the distance between the substrate 12 and the surface 16 of the substrate support structure 13. The nominal height further has an influence on the obtainable clamping pressure. Selection of the nominal height of the substrate supporting elements 17 generally will be a trade off between a desirable clamping pressure and a reasonable risk for distortion by particles.

A lower height generally increases the obtainable clamping pressure. A higher clamping pressure generally improves the clamp stability. Additionally, a lower nominal height reduces the thickness of the clamping layer, and consequently improves heat transfer between the substrate 12 and the substrate support structure 13.

On the other hand, although there are not many wandering particles present in a vacuum system, their appearance on the substrate supporting structure surface may cause serious local instabilities, in particular if their size exceeds the nominal height of the substrate supporting elements 17. Consequently, a higher height reduces the chance of being confronted with such negative impact.

Other parameters that may be varied to obtain a desirable clamping pressure include material properties of the substrate 12, material properties of the surface 16 of the substrate support structure 13, the surface area of the surface 16, the shape and number of the substrate supporting elements 17, the substrate supporting element pitch, and the type of liquid used to form the clamping layer 11. As a specific measure, one or both of the contacting surfaces of the substrate 12 and the substrate support structure 13 may be surface treated, or coated with a material for influencing a contacting angle between the liquid forming the clamping layer 11 and the relevant contacting surface.

The surface 16 of the substrate support structure 13 may be circumscribed by a moat or channel 19 or similar structure. The moat 19 can be used in the procedure to establish the clamp. For this purpose, the moat 19 may be connected to a liquid conditioning system and/or a gas conditioning system. In the procedure of establishing the clamp one or more actions including supply of clamping liquid, removal of excess liquid and distribution of dry gas may be performed via the moat 19. The gas distribution action preferably includes distributing a dry gas along the circumference of the outer surface of the substrate supporting structure surface to enable further removal of excess clamping liquid so as to enable establishment of the clamp. Suitable dry gases for use in the gas distribution action include nitrogen and inert gases like argon, although other gases may also be used.

The liquid conditioning system may be configured to supply liquid to the substrate support structure surface and/or, after placement of the substrate on top of a liquid layer, to remove liquid underneath the substrate to enable formation of clamping layer. Further details regarding the formation of a clamping layer by using external supply of liquid and a liquid removal system using a moat is described in U.S. patent application Ser. No. 12/708,543, the content of which is incorporated herein by reference in its entirety.

In its turn, the moat 19 may be circumscribed by a sealing structure 21 for limiting leakage of vapor from the clamping layer 11 and moat 19 to the surrounding environment. Preferably, the top side of the sealing structure 21 has a level corresponding in height with the nominal height of the substrate supporting elements 17.

As mentioned earlier, the moat 19 may be in contact with a gas distribution system, e.g. via one or more gas inlets 23 and one or more gas outlets 25. If a sealing structure 21 is present, a gas flow may be established between the substrate supporting structure surface 16 provided with a liquid layer and the sealing structure 21, thus forming a channel flow as shown in FIG. 2B by the dashed arrows.

The one or more gas inlets 23 and the one or more gas outlets 25 may be provided along the moat 19 in a symmetrical fashion. In the embodiment of FIG. 2B, there are two gas inlets 23 and two gas outlets 25. The gas inlets 23 and gas outlets 25 may be positioned in such a way that a first virtual line 27 formed by connecting the two gas inlets 23, and a second virtual line 29 formed by connecting the two gas outlets 25 are substantially perpendicular with respect to each other.

In some of the embodiments shown in the drawings, a moat 19, sealing structure 21, or related components are not shown. However, it should be understood that these embodiments may also include these features, and that the moat and/or sealing structure may also be omitted from the embodiments shown having these features.

Figure 3:
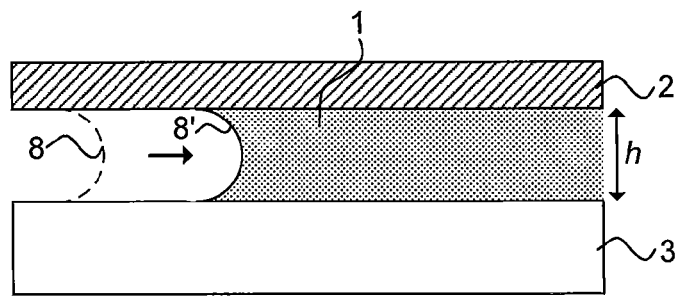
FIG. 3 is a sectional view schematically illustrating the process of evaporation along an outer surface of a clamping layer.

FIG. 3 is a sectional view schematically illustrating the evaporation process from the liquid clamping layer 1. This evaporation at the liquid layer interface, i.e. evaporation at the concave liquid surface, has a negative impact on the stability of the clamp. Due to evaporation, the position of the outer liquid surface 8 may shift inwards towards a new position to form outer liquid surface 8'. As a result of that shift, the surface area covered by the liquid clamping layer 1 reduces, and thus the surface area used to clamp the surfaces 2 and 3 together is reduced. As a result, the stability and strength of the clamp decreases. If the surface area covered by the clamping layer 1 becomes too small, the clamp may break up and the surfaces 2 and 3 are no longer held together.

While examining the causes of clamp failure, the inventors identified that one of the main mechanisms that induces the breaking up of a clamp is a mechanism referred to herein as substrate peeling. FIG. 4 schematically illustrates the concept of substrate peeling. Without wishing to be bound by theory, it is believed that due to variation in the rate of evaporation along the outside surface of the liquid clamping layer 11, the edge of the substrate 12 may start to lift away from the substrate support structure 13 at a point with higher evaporation due to receding of the liquid clamping layer. The movement of lifting is schematically represented in FIG. 4 by the arrow 71. Due to this peeling, vapor may more easily leak away from the liquid clamping layer 11 (shown by arrow 72). Additionally, the surface area of the outer liquid surface 18 of the liquid clamping layer 11 increases, which leads to an increase in evaporation rate. Furthermore, the local peeling causes the clamping layer 11 to recede further from the area where the peeling occurs, leading to further peeling and unclamping. In this way, local peeling may limit the lifetime of the clamp significantly.

It is desirable to extend the average lifetime of a clamp, in particular for use in lithography related applications, so that the clamp can be maintained and the substrate held in a clamped position during sometimes lengthy processing of the clamped substrate. The lifetime of the clamp can be extended using a variety of measures. These include, for example, including a sealing structure around the clamping liquid for substantially closing off the circumferential opening facing the clamping liquid surface, providing a cantilever arrangement for the substrate to achieve a substantial closing-off of the circumferential opening between the substrate and a sealing structure or surface of the substrate support structure, modifying the surface of the substrate support structure to include areas with different capillary potential for capillary layer localization, and including a reservoir of liquid for sacrificial evaporation into the area around the clamping liquid. In addition, the surface of the substrate supporting structure may be divided into compartments to avoid propagation of bubbles in the clamping liquid layer, and a moat may be used around the perimeter of the surface with a stepped portion to absorb condensation droplets to avoid disturbance to the clamping liquid layer. These measures, explained in more detail herein, may be used singly or in any combination with each other.

Another issue for a clamp to be used in a vacuum environment is to avoid excessive leakage of the clamping liquid into the vacuum. This is an important consideration for applications such as charged particle lithography which is performed in a vacuum chamber, where excess water in the chamber is detrimental to the lithography process. The use of a sealing structure and/or a cantilever arrangement, each alone or in combination with other measures, can be beneficial for reducing vapor leakage from the clamping liquid layer as well as prolonging the life of the clamp.

Sealing Structure

Figure 4A:
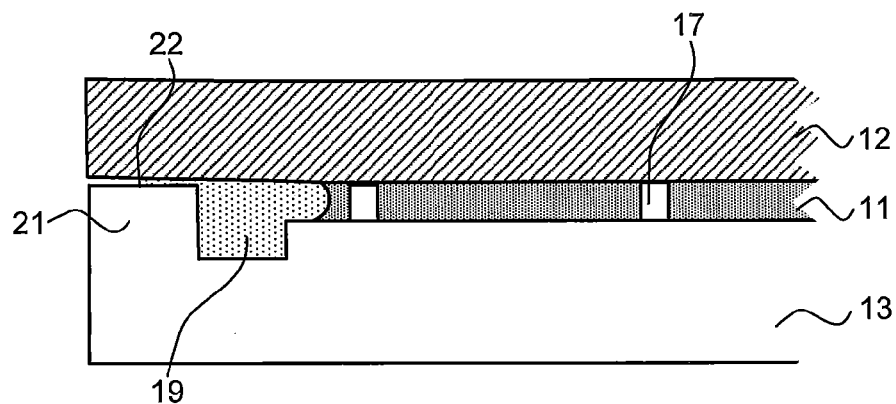
FIGS. 4A and 4B are section views of a substrate support structure including a sealing structure.

As mentioned above, a sealing structure may be included for substantially closing off the circumferential opening facing the clamping liquid surface, such as the vapor limiting ring-shaped structure or rim 21 around the clamping liquid described above. FIG. 4A shows a substrate support structure 13 with sealing structure 21 in the form of a heightened rim. The top surface 22 of the sealing structure preferably has a level corresponding in height with the substrate supporting elements 17, so that the sealing structure touches the substrate near its perimeter or forms a narrow gap between the sealing structure and the substrate. Such an arrangement may function to substantially close off the circumferential opening facing the clamping liquid surface to reduce vapor leakage. The formation of an enclosed space around the clamping liquid (in this case formed by the rim 21, moat 19, clamping liquid 11, and bottom surface of the substrate 12) may also aid in extending the lifetime of the clamp, by permitting the clamping liquid and its vapor to reach partial pressure, thereby reducing the evaporation rate from the clamping liquid.

Figure 4B:
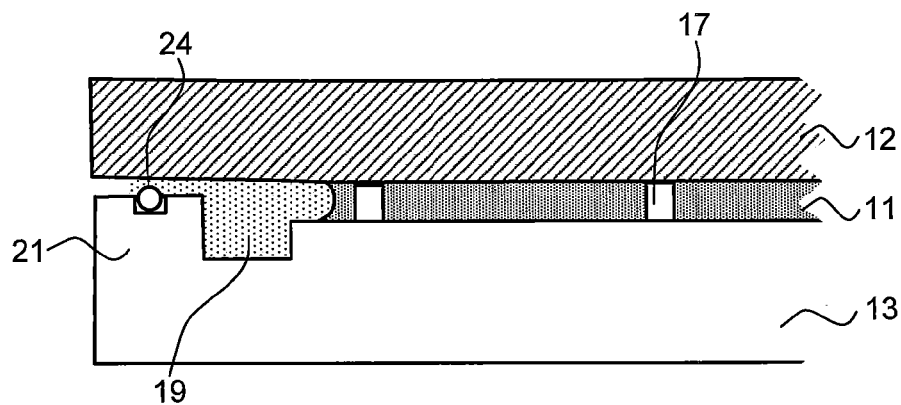
Figure 5:
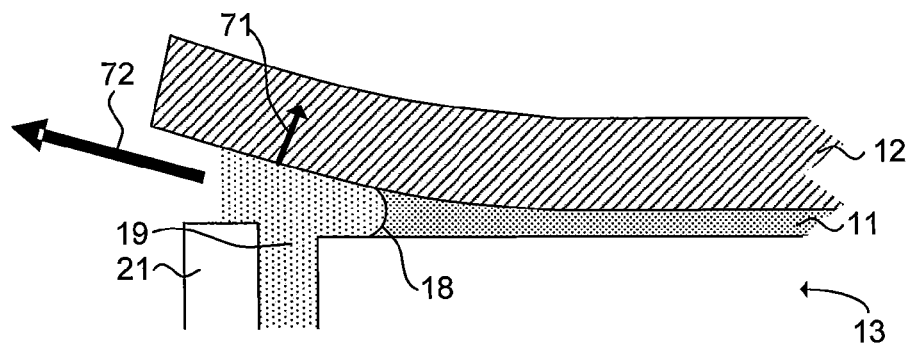
FIG. 5 schematically illustrates the concept of substrate peeling.

The sealing structure 21 may comprise a top surface 22, or one or more elastically deformable elements such as O-rings or C-rings, e.g. made of Viton or rubber, may be used at the top surface to assist in making a vapor seal against the substrate. An O-ring 24 is shown in the embodiment of FIG. 4B disposed in a recess in the sealing structure so that the top of the O-ring is set to the level of the substrate supporting elements. The O-ring may be provided with an incision at a radial side, e.g. the radial side facing the center of the substrate support structure 13, such that the O-ring can be compressed between substrate support structure 13 and substrate 12 without undue force, but sufficient to limit leakage of vapor. Alternatively or additionally, a hard ridge or knife edge (e.g. ridge 26 shown in FIG. 7B) may be formed in the top surface of sealing structure 21 extending upwards to form an outer sealing ring.

A narrow sealing rim (i.e. a narrow top surface of the sealing structure) decreases the chance that particles or contaminants will be caught on the top surface of the sealing rim, trapped between the substrate and the rim and creating a gap through which vapor can leak. However, a wider sealing rim creates a longer escape path for vapor leakage, providing more resistance to escape of the vapor. Thus, there is a trade-off between a narrow and wide sealing rim (compare e.g. FIGS. 7A and 7B described below). A wider sealing rim, when the substrate contacts it correctly, creates a longer restricted leak flow path, increasing flow resistance for vapor leaking through the seal and decreasing leak rate. However, a wide sealing rim also increases the area susceptible to small particles, which, if trapped in between the substrate and the sealing rim, will cause local deflection of the substrate and a leaky seal. Optimal sealing rim width thus depends on the cleanliness of the environment and the probability of particles disturbing the seal.

The top surface of the sealing structure or top edge of an outer sealing ring can be made very smooth to avoid unwanted gaps between the ring and the bottom surface of the substrate.

Preferably the top surface 22 of sealing structure 21, top surface elastically deformable elements 24, or top edge of ridge 26, are positioned at or below the level of the top of the substrate supporting elements. A top surface or edge above the top of the substrate supporting elements tends to induce peeling of the substrate which reduces the life of the capillary clamp.

The use of a sealing structure as described above for achieving a narrow gap or seal against the substrate has been found to have some problems. A lifting effect caused by vapor pressure, and gaps caused by bow, warping or deformation of the substrate are not compensated for in this arrangement. Moreover, the sealing performance is unpredictable due the unpredictable nature of such distortions in the substrate. Furthermore, a certain nominal leak of vapor will usually be present in this design. A hard sealing structure will allow a nominal leak through the narrow gap formed against the substrate, and a deformable sealing structure such as an O-ring or C-ring has a certain roughness (about 100 nm or greater) that also allows a nominal leak.

Figure 6:
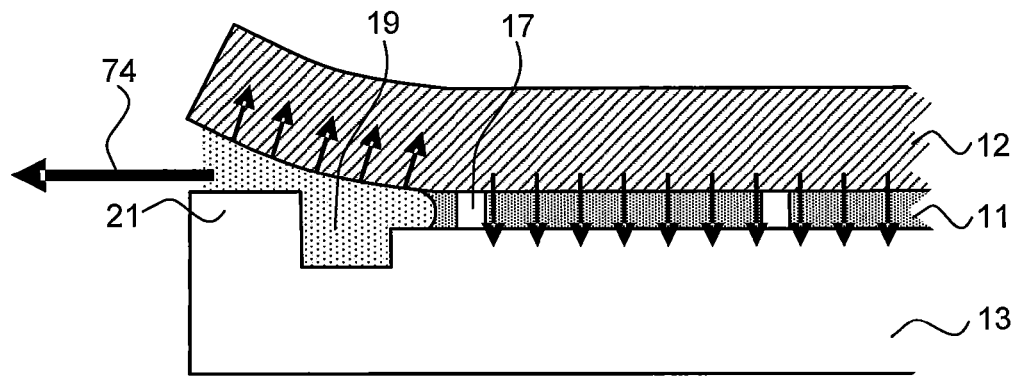
FIG. 6 schematically illustrates the concept of vapor emission towards external surroundings.

FIG. 6 schematically illustrates vapor leakage due to substrate edge lifting or bow. Vapor evaporated from the liquid clamping layer is released in the space around the clamping liquid, including the moat 19, as indicated by the dotted area. If the pressure in this space exceeds a certain threshold value the substrate will be lifted slightly (represented by the arrows pointing upwards) while the remainder of the substrate is pulled downwards (represented by the arrows pointing downwards). The gap between the substrate and the sealing structure increases and the vapor "escapes" to the surroundings, schematically represented by arrow 74. This lifting of the substrate edge and widening of the gap may also result because of bow in the substrate or other distortions in the substrates shape. This can be a particular problem when very thin substrates are involved.

This may be a particular problem when a vacuum environment surrounds the arrangement. In lithography applications performed in a reduced pressure environment, it is desirable to keep the extent of vapor emission into the vacuum environment to a minimum.

Cantilever Arrangement

A cantilever arrangement may be used to address the problems mentioned above. This may be achieved by increasing the overhang at the edge of the substrate by spacing the substrate supporting element(s) at a certain minimum distance from the perimeter of the surface 16 of the substrate support structure, so that the substrate moves downward at its edge to substantially close-off the circumferential opening facing the clamping liquid surface and further limits release of vapor evaporated from the liquid clamping layer towards the surrounding environment. A sealing structure may be used at or near the perimeter of the substrate to improve the seal against the substrate. This measure may be used for any of the embodiments of the substrate support structure.

Figure 7A:
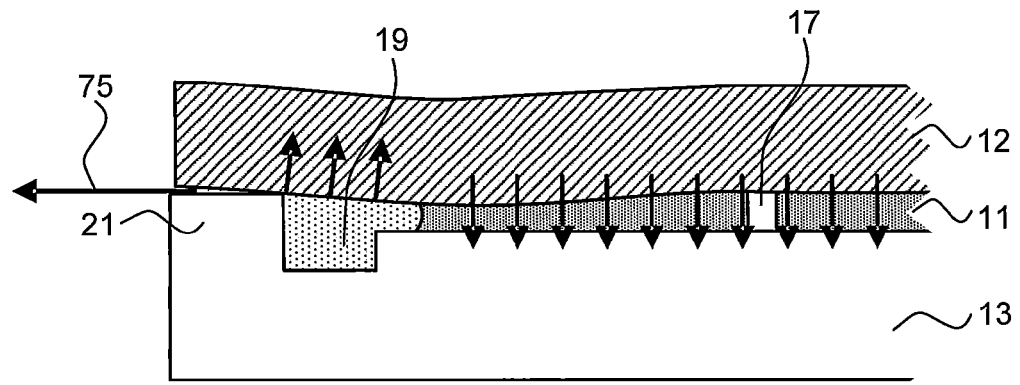
FIGS. 7A and 7B schematically illustrate the effect of alternative placement of substrate supporting elements in comparison to FIG. 6.

FIG. 7A schematically illustrates the situation where the outer substrate supporting element of the surface of FIG. 6 is removed so that the distance between the edge of the substrate and the outermost substrate supporting structure 17 is increased. As a result, the substrate portion extending from the last substrate supporting element is increased, forming a cantilevered portion. This cantilevered portion of the substrate is pulled down towards the sealing structure 21 due to the clamping force exerted by the capillary clamping layer (shown by the arrows pointing downwards), counteracting the upward force due to the vapor pressure in the space around the clamping liquid and bow in the substrate. The sag in the substrate reduces the gap between the substrate and the sealing structure and preferably results in the substrate substantially closing off the gap. The perimeter of the substrate is preferably forced against the sealing structure, assuring contact and closing off the gap between the substrate and the sealing structure even when there is some bow in the substrate. The cantilever seal can thus counteract the force of vapor pressure pushing the substrate away from the sealing rim, and can overcome a certain amount of bow in the substrate (either positive or negative), greatly increasing predictability of the seal.

Figure 7B:
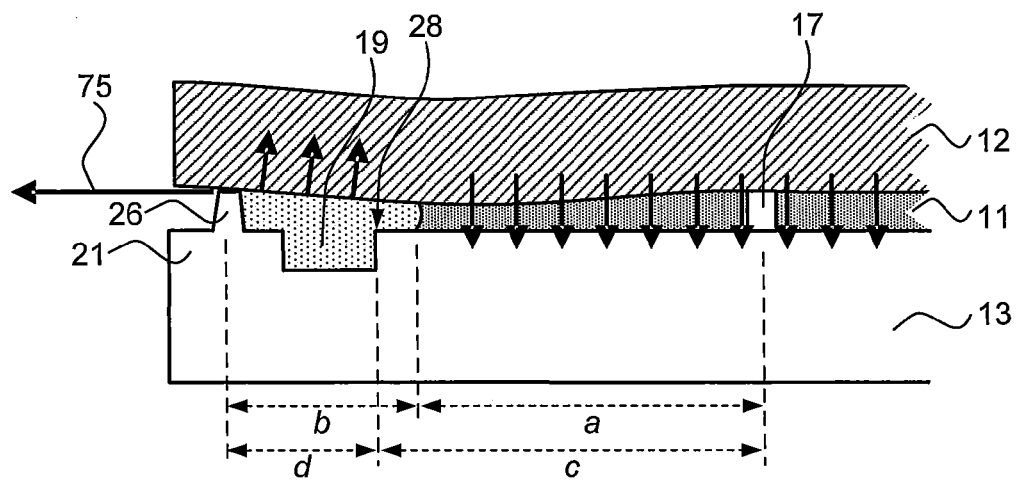

In order to generate sufficient downward force on the periphery of the substrate to create an effective seal, the cantilevered portion of the substrate should be sufficiently large and the area of the clamping liquid layer acting on the cantilevered portion should be sufficiently large. This may be accomplished by arranging for a sufficiently large distance from the outermost the substrate support structure 17 to the periphery of the clamping liquid layer (i.e. the position of the meniscus formed on the outer surface of the clamping liquid layer). This is illustrated in FIG. 7B as distance "a". The large clamping area under the cantilevered portion exerts a correspondingly large downward force, pulling the substrate down to form a good seal against the sealing rim of the sealing structure 21 or ridge 26.

The vapor pressure in the space between the meniscus of the clamping liquid layer and the sealing structure will exert an upward force on the substrate near its periphery. To form a good seal, the downward force exerted by the clamping layer on the cantilevered portion of the substrate should be large enough to counteract the upward force exerted by the vapor pressure and bring the substrate into contact with the sealing rim. In order to ensure this, the clamping area under the cantilevered portion should be sufficiently large in comparison to the area of the substrate exposed to the upward vapor pressure. In one embodiment the distance a is significantly larger than the distance from the meniscus of the clamping liquid layer to the sealing rim, shown as distance "b" in FIG. 7B. For example distance a may be two or more times larger than distance b. This ensures that the balance of forces on the cantilevered substrate portion is biased downward, towards the sealing rim.

Because the position of the meniscus of the clamping liquid layer may vary, the geometry of the substrate support structure may alternatively be defined by reference to the periphery of the clamping surface 16, i.e. the outer edge 28 of the surface on which the clamping liquid layer is formed (indicated in FIG. 7B). The outer edge 28 may be defined, for example, by the radial position of the inner wall of the moat 19 (as in the embodiment shown in FIG. 7B), the outer edge of a circumferential rim 41 (FIG. 9) or a second portion 52 (FIG. 11A, 12), the inner wall of a stepped portion 83 (FIG. 16B, 17B), the inner wall of channels 43 (FIG. 18A), or any other structure creating an outside edge of the clamping surface. Thus, the substrate support structure preferably has a sufficiently large distance from the outermost substrate support structure to the periphery of the clamping surface 16 (outer edge 28), illustrated in FIG. 7B as distance "c". Similarly, the distance c is preferably significantly larger than the distance from periphery of the clamping surface 16 to the sealing rim of the sealing structure 21 or ridge 26, illustrated in FIG. 7B as distance "d". In one embodiment that distance c may be two or more times larger than distance d. This ensures that the balance of forces on the cantilevered substrate portion is biased downward, towards the sealing rim.

In addition, the actual distances a and c are preferably large enough so that a slight downward deflection of the cantilevered portion of the substrate occurs, so that any bow or warp in the substrate (e.g. an upward deflection near the substrate's periphery) can be counteracted. The substrate support elements 17 are preferably arranged to provide support for the substrate at locations sufficiently close together to avoid significant downward deflection (sag) of the substrate between the support locations. The substrate support elements may be arranged in a regular pattern, with the pitch between the support locations sized to avoid significant sag in the substrate between the support locations. In some embodiments the distance c is substantially equal to or larger than a nominal distance between the support locations, while the distance d is substantially equal to or smaller than such nominal distance. Preferably, the distances a and c are significantly larger than the nominal or maximum distance between the support locations of the substrate support elements. For example, for a silicon substrate 0.775 mm thick, a pitch of 3 mm or less between support locations may be used and a distance a of 5 mm or more would be suitable. In one embodiment the distance a and/or c is equal to or greater than twice the maximum distance between the substrate support locations.

The pressures exerted on the cantilevered portion of the substrate may be regarded as torques acting from the position of the outermost support location, the clamping force under the cantilevered portion acting in a downwards direction and the vapor pressure acting in an upwards direction. If the clamping liquid layer recedes towards the center of the substrate support structure at any location around the periphery of the layer (e.g. due to evaporation of the clamping liquid), the downward clamping force will be reduced due to a smaller clamping area and shortened torque arm. However, the upward force will remain constant, or increase due to a larger area between meniscus and sealing rim filled with vapor. Thus, the balance between the upward and downward forces may shift so that there is no longer sufficient downward pressure to provide a sufficient seal and vapor leakage may increase in the area where of the retreating meniscus. The clamp localization measures described below may be used to prevent or reduce the occurrence of retreat of the meniscus, resulting in a longer lasting and tighter cantilever vapor seal.

With contact between the bottom surface of the substrate and the top surface of the sealing structure established, the tightness of the vapor seal is limited by the roughness of the two surfaces and the presence of particles which can become lodged between the two surfaces and create gaps. The top edge of the sealing structure against which the substrate contacts may be made very smooth, preferably with roughness reduced to 10 nm or less, to avoid unwanted gaps between the substrate and sealing structure and greatly reduce the vapor leak rate (schematically represented by the smaller arrow 75 compared to arrow 74 in FIG. 6).

The sealing structure 21 may be formed as described above (e.g. in the discussion of FIGS. 4A and 4B), for example with a top surface 22 including a hard surface or elastically deformable elements 24, or a narrow ridge 26 extending upwards from the sealing structure 21 as shown in FIG. 7B to form a sealing rim. As noted previously, there is a trade-off between a wide sealing rim as shown in FIG. 7A and a narrow sealing rim as shown in 7B. A wider sealing rim creates a longer flow path with higher flow resistance for vapor leaking through the seal, when the substrate contacts the sealing rim correctly, but is also more susceptible to small particles causing local deflection of the substrate resulting in a leaky seal. The optimal width of the sealing rim thus depends on the cleanliness of the environment in which the clamped substrate is used.

Preferably the sealing rim (i.e. the top surface of the sealing structure, elastically deformable elements, or narrow ridge) is positioned at about the same level as the top of the substrate supporting elements, or slightly above or below this level. Due to downward pressing of the substrate caused by the cantilever arrangement, there is more latitude in the relative positioning of the top surface or edge, and peeling of the substrate is less likely even when the sealing structure is slightly above the level of the substrate supporting elements. In addition, the inclusion of the circumferential anti-peeling rim described below further reduces the likelihood that this peeling will occur, and a higher sealing structure may be beneficial to induce a greater sealing force between the substrate and the substrate supporting structure and provide a better seal.

The cantilever seal improves both clamp duration and reduces vapor leakage, and requires no additional clamp preparation steps. It is also relatively simple and cheap to implement, and does not increase the bulk of the substrate support structure, unlike some of the other solutions.

The cantilever seal may be sufficient so that the other measures described herein to prolong the clamp life and reduce vapor leakage are not needed. If the cantilever seal works perfectly, no vapor leakage occurs and there is no need for additional measures such as the capillary layer localization. However, if the seal is imperfect (as it usually is), the substrate peeling mechanism described below may still occur, which may destroy the seal in one location and allow vapor leakage and quicker evaporation from the clamping liquid layer. Thus, it is preferable to additionally use the capillary layer localization described below and/or the other measures described herein to minimize substrate peeling and stabilize the clamp.

Capillary Layer Localization

As mentioned above, the surface of the substrate support structure may be modified to include areas with different capillary potential to influence the movement of the clamping liquid to strengthen the clamp in critical areas. The capillary potential can be defined as the potential to attract liquid by capillary pressure. A surface portion with a high capillary potential is attractive for the clamping liquid, while a surface portion with a lower capillary potential is less attractive. This characteristic can be used to create a flow of the clamping liquid in a predetermined direction to ensure that evaporating liquid is replenished at the critical locations.

In particular, the inventors discovered that a substrate support structure provided with a surface comprising portions with different capillary potentials can result in a clamp that on average lasts for a longer period of time. The different surface portions should be arranged such that a predictable capillary flow within the clamping layer is established. The capillary flow may be induced by movement of liquid within the clamping layer from a point with low capillary potential to a point with higher capillary potential, particularly a point at the outer surface with a high evaporation rate. Based on the particular circumstances the capillary flow may be directed in a predictable way by suitable arrangement of the different surface portions on the surface of the substrate support structure.

The capillary potential of a surface portion may be influenced in several ways. Throughout this description, embodiments of the invention will be described with reference to the use of different height levels. The use of different height levels is a robust way to obtain portions with different capillary potential. A surface portion with a lower height level will accommodate a relatively thick clamping liquid layer between the substrate and the surface portion. The capillary potential of this surface portion will be relatively low compared to a surface portion with a higher height level and a relatively thin clamping liquid layer.

Other ways of achieving different capillary potentials for surface portions include, but are not limited to surface treatment, selection of different materials for each surface portion, and the providing of one or more coatings on the surface portions. In case of water, for example, a portion of the surface may be made substantially hydrophilic, or a portion of the surface may be made substantially hydrophobic, or both techniques may be combined. Water applied to the surface will then be attracted to the relatively more hydrophilic surface portions.

Figure 8A:
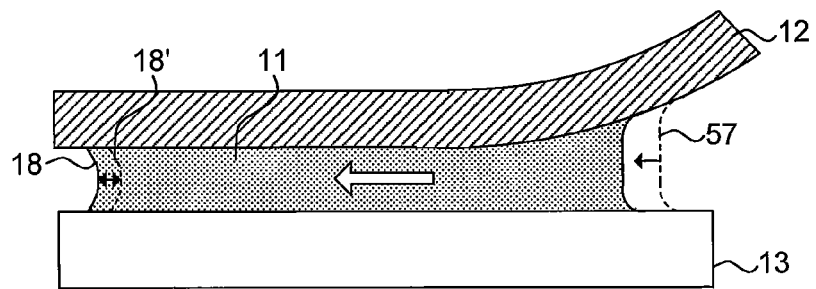
FIGS. 8A and 8B schematically illustrate the differing capillary potentials.

FIG. 8A shows the concept of substrate peeling. In this case, the substrate lifts at the right hand side, which enlarges the outer surface of the clamping layer 11 at this location. Due to the lifting of the substrate 12, more vapor will leak into the surrounding vacuum system near the lifted substrate region. To compensate for the loss of vapor, the evaporation of clamping liquid increases. Furthermore, the substrate lifting causes a stretching of the outer surface 22 near the lifted region of the substrate 12. This stretching induces a decrease in meniscus curvature, i.e. a less concave outer surface. As mentioned earlier, a less concave outer surface corresponds to a smaller pressure difference across the surface. As the vapor pressure remains about the same along the outer surface, a pressure difference arises within the clamping layer 11. In FIG. 8A, the pressure within the clamping layer at the right outer surface will be higher than the pressure within the clamping layer at the left outer surface. Or, in other words, the capillary potential at the left outer surface is higher than the capillary potential at the right outer surface, and as a result, a capillary flow is induced within the clamping layer from the right towards the left, schematically denoted by the white arrow. This capillary flow may enable the outer surface 18 at the left side to keep its original position. Alternatively, if the left outer surface did already retract to form an outer surface 18', the capillary flow may allow the outer surface to return to its original position. The retraction and return action is schematically denoted by the double arrow. At the right hand side of the clamp in FIG. 8A, the capillary flow causes the outer surface 22 of the clamping layer 11 to retract as schematically denoted with the arrow. Due to the removal of liquid underneath the substrate 12 the area covered by the clamping layer 11 decreases. The lack of clamping force at the right hand side may cause further lifting of the edge of the substrate 12 which may result in further degradation of the clamp and may eventually lead to clamp failure.

Figure 8B:
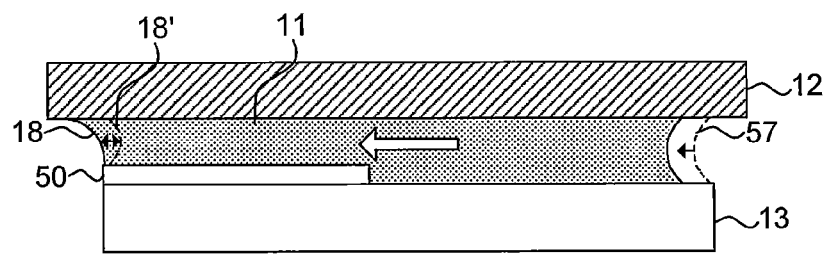

FIG. 8B schematically shows the concept utilized in several embodiments of the invention. The inventors have realized that similar differences in the meniscus curvature can be induced by forming a substrate support structure 13 with a surface comprising portions with different height levels. In FIG. 8B, element 50 represents a portion of the substrate support structure surface with an elevated height level as compared to the remainder of the surface.

In equilibrium, the meniscus on the left hand side and on the right hand side have a substantially identical curvature. As a result of evaporation, the outer surface 18 on both sides may recede slightly. As can be readily seen, the height of the liquid clamping layer 11 between the substrate 12 and the substrate support structure 13 at positions within the area covered by element 50 is smaller than the height of the liquid clamping layer 11 at positions not covered by element 50. Retraction of the outer surface 18 at the left hand side will result in a decrease of meniscus height and an increase of its curvature. At the right hand side, retraction of the outer surface does not have a significant effect on the size and shape of the meniscus. As a result, a capillary flow is induced in a similar way as discussed with reference to FIG. 8A (represented by white arrow). The capillary flow allows for replenishment of liquid at the perimeter of the clamping layer at the left hand side such that the outer surface 18 regains its position, while the outer surface at the right hand side recedes from a position 22 towards a more inward position.

Figure 9:
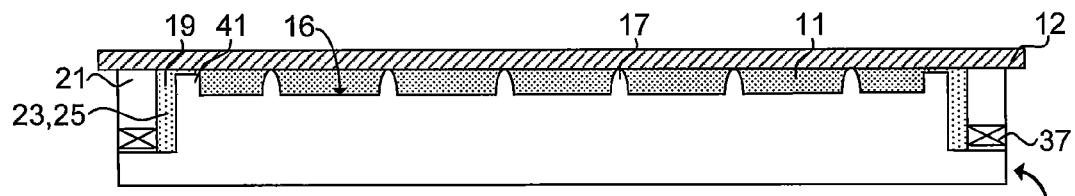
FIG. 9 is a sectional view of a substrate support structure including a circumferential rim.

FIG. 9 is a sectional view of a substrate support structure 13 supporting a substrate 12 according to an embodiment of the invention. The substrate support structure 13 of FIG. 9 comprises a circumferential rim 41 for preventing peeling or localization of the clamping. The circumferential rim 41 provides a smaller distance between the substrate support structure 13 and the substrate 12. The nominal distance between the substrate support structure 13 and the substrate 12, in FIG. 1 referred to as height h, is typically is about 3-10 microns. The distance between the circumferential rim 41 and the substrate 12 would typically lie in the range of 500 nm to 1.5 microns. Preferably, the circumferential rim 41 has a height being less than 1 micron smaller than the nominal height of contact elements provided on the surface 16 of the substrate support structure 13.

Figure 10C:
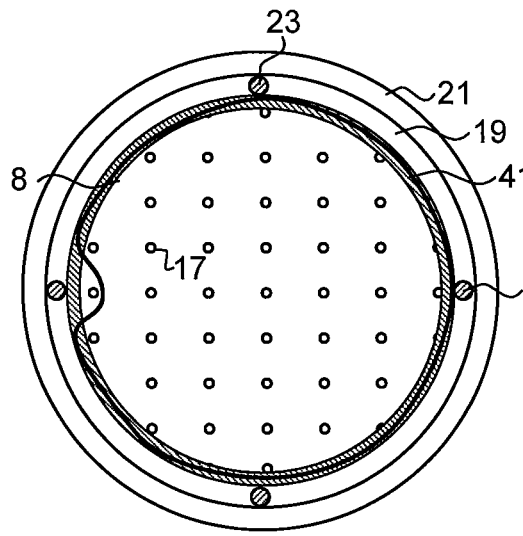
Figure 10C:
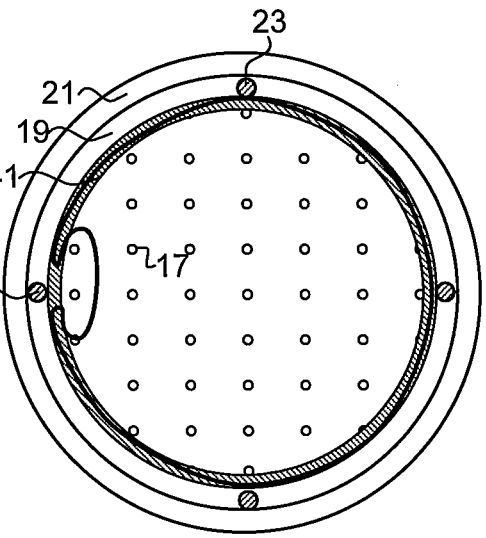
Figure 10C:
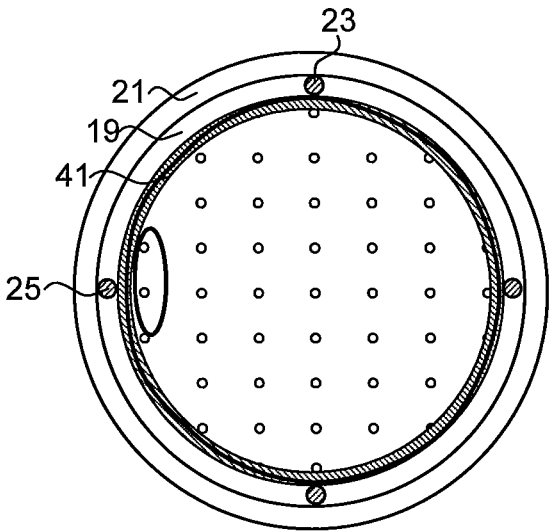

Without wishing to being bound by theory, the circumferential rim 41 is believed to limit substrate peeling in a way described with reference to FIGS. 10A-10C showing top views of the substrate support provided with a clamping layer. Although the presence of a circumferential rim 41 has been discussed with reference to FIG. 9, the use of such circumferential rim 41 is not limited to this embodiment but may be used with any of the other embodiments described herein.

First, as liquid evaporates from the outer surface 8, it will recede into the small gap between the circumferential rim 41 and the substrate 12. Due to non-uniform evaporation, the outer surface 8 may locally recede further inwards as schematically shown in FIG. 10A. The pressure difference over the smaller gap between the circumferential rim 41 and the substrate 12 is much larger than the pressure difference would be in the main clamping area, e.g. about 1 bar versus about 200 mbar respectively. In other words, the capillary potential at the circumferential rim 41 is higher than the capillary potential in the main clamping area. When the outer surface 8 reaches the inner side surface of the circumferential rim 41 due to evaporation, the surface encounters the larger distance between substrate 12 and substrate support structure 13. The lower pressure difference in this region causes a small amount of liquid to flow into the gap between the circumferential rim 41 and the substrate 12 as is schematically shown in FIG. 10B. The flow will continue until the gap between the circumferential rim 41 and the substrate 12 is completely filled as shown in FIG. 10C. A void will be left in the main clamping region. The void is entirely surrounded by a liquid layer. Effectively, the lost capillary clamping area due to evaporation has been moved inwardly. The outer capillary surface remains at the same position. As a result, the substrate edge will not peel off easily, and the clamp lifetime will be extended. By avoiding or reducing peeling, the circumferential rim 41 also reduces leakage of vapor by avoiding introducing a gap or increasing the size of a gap between the substrate and a sealing structure at the perimeter of the substrate support structure.

Figure 11A:
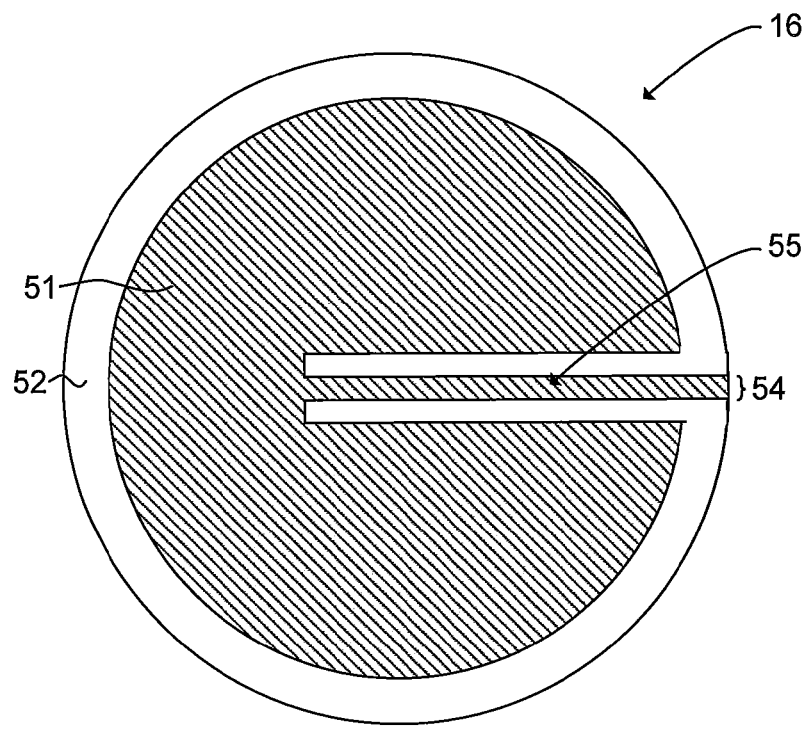
FIG. 11A is a top view of a substrate support structure having areas of different capillary potential.

FIG. 11A schematically shows a top view of a surface 16 of a substrate support structure according to an embodiment of the invention. For reasons of clarity some additional structures that may be present, e.g. substrate supporting elements, a moat and/or sealing structure shown in the other drawings, are not shown in FIG. 11A. In this embodiment, the surface comprises portions of two different height levels. A portion of the surface having a first height level is represented by the hatched area (direction hatching from top left to bottom right), hereafter referred to as first portion 51. A portion of the surface having a second height level is represented by the unhatched area, hereafter referred to as second portion 52.

The height level of the first portion 51 is lower than the height level of the second portion 52. If a liquid clamping layer is formed on top of the substrate support structure surface 16, the thickness of the liquid clamping layer on top of the second portion 52 will be less than its thickness on top of the first portion 51, for example 2-4 microns, preferably 3 microns, versus 3-10 microns, preferably 5 microns, respectively.

Figure 11B:
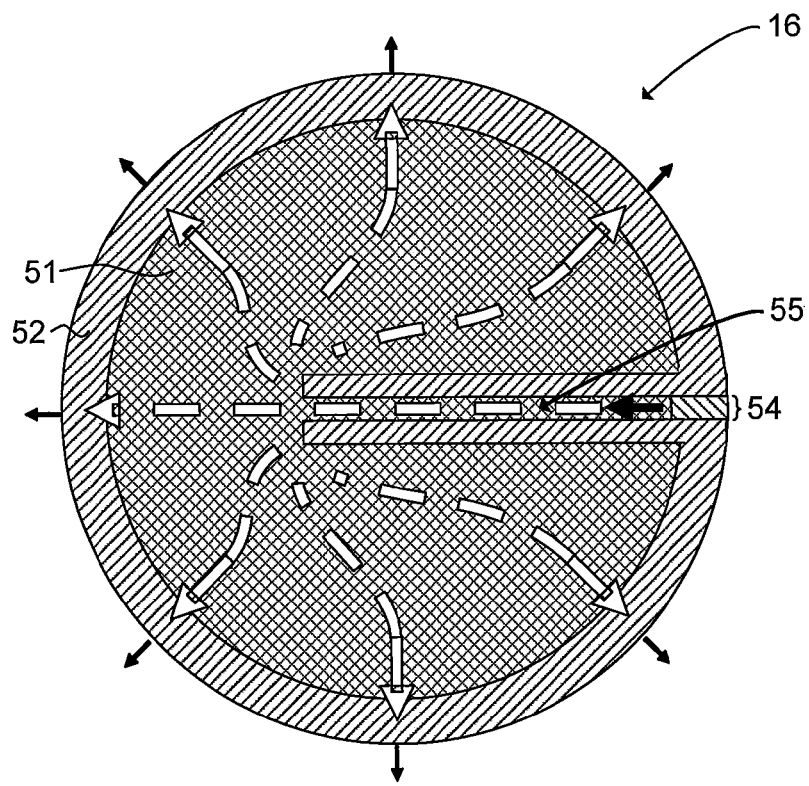
FIG. 11B is a top view of the substrate support structure of FIG. 11A with a clamping layer.

FIG. 11B schematically shows a top view of the substrate support structure surface 16 of FIG. 11A covered by a clamping liquid layer (schematically represented by the hatched profile with hatching from bottom left to top right). For clarity, the substrate is not shown. The outer surface of the liquid clamping layer is predominantly contacts the portion of the substrate support structure surface 16 with a higher height level, i.e. second portion 52. However, at a single position, i.e. the position denoted by reference number 54, the outer surface is in contact with the portion of the surface 16 with lower height level, i.e. first portion 51. As explained with reference to FIG. 8B, retraction of the outer surface will be concentrated at this gap position, further referred to as a sacrificial gap.

In FIG. 11B, the outer surface of the clamping liquid is retracting in the direction of the large black arrow within the channel 55. As explained with reference to FIGS. 8A, 8B, a capillary flow (schematically shown by the white arrows in FIG. 11B) is induced within the clamping layer. The capillary flow allows for the supply of liquid to the outer surface of the liquid clamping layer in contact with the second portion 52 so as to limit retraction of the outer surface of the clamping liquid layer due to evaporation (small black arrows) at the perimeter in contact with the second portion 52.

The height difference between the height level of the first portion 51 and the height level of the second portion 52 is such that flow resistance can be overcome by capillary pressure differences. Furthermore, in order to prevent retraction of the outer surface at the perimeter of the clamping layer in contact with the second portion 52, the flow rate of the capillary flow may be arranged so that it can keep pace with the evaporation rate of clamping liquid at the outer surface of the clamping layer.

By allowing retraction of the outer surface at specific predetermined locations, i.e. locations of the outer surface located in contact with the first portion 51, and compensating for evaporation of clamping liquid from the remainder of the outer surface, i.e. locations of the outer surface in contact with the second portion 52, the majority of the outer surface of the liquid clamping layer is kept in place during the clamping process.

In this embodiment the channel 55 acts as a source of liquid to replenish liquid lost by evaporation from the outer surface at the perimeter of the clamping liquid layer. Liquid is drawn from the channel by capillary flow, and the liquid flows over the second (lower) portion 52 to replenish liquid at the first (higher) portion 51 around the perimeter of the substrate support structure. As more evaporation occurs, the outer surface of the liquid in the channel recedes along the length of the channel, gradually emptying the channel to replenish the clamping layer at the first portion 51 around the perimeter. As a result, the clamp lifetime can be extended.

The design of the distribution of the first portion 51 and the second portion 52, as well as the location and number of one or more sacrificial gaps 54 may determine to what extent the clamp lifetime can be extended. The design shown in FIGS. 11A, 11B shows a single location along the perimeter of the substrate support structure surface with a lower height level, i.e. a single option for developing a sacrificial gap. To lengthen the time during which there is only retraction of the outer surface of the clamping layer via the single sacrificial gap, the first portion 51 comprises a portion that takes the form of a channel 55. Preferably, the width of such channel would be smaller than the pitch of substrate supporting elements, e.g. burls. For example, if the pitch of burls would be about 3 mm, the width of the channel could be about 0.5-3 mm, e.g. 1.5 mm.

Figure 12:
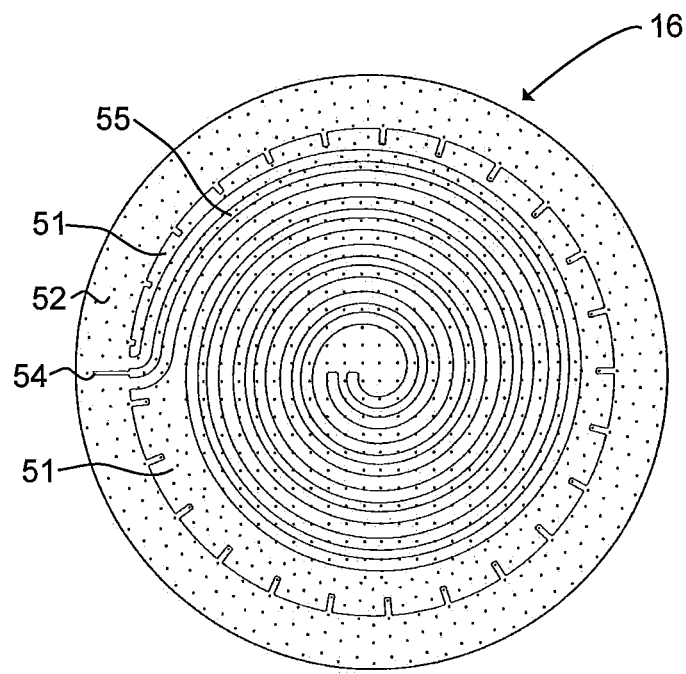
FIG. 12 is a top view of a substrate support structure with a spiral channel.

In order to further lengthen the lifetime of the clamp, the channel may comprise a curved portion. In an even further embodiment, the channel may take the form of a spiral, an example of which is schematically shown in FIG. 12. The length of such a channel can be very large. For example, in case of a substrate with a diameter of 300 mm, and an allowable void area within the liquid clamping layer of 20% of the total area, a channel with a channel width of 1.5 mm could reach a length of 6000 mm. Such long channel length increases the period during which evaporation takes place at a specific predetermined location at the outer surface of the clamping layer.

In the embodiment of FIGS. 11A, 11B, the channel extends from a predetermined position., also referred to as sacrificial gap 54, along the perimeter with the lower height level. The predetermined position 54 is located such that the outside surface of the clamping layer as initially established contacts the channel.

The channel in the embodiment of FIG. 12 does not start at the perimeter of the substrate support structure surface, but starts at a location slightly radially inwards therefrom. Such position allows the liquid clamping layer to stabilize such that its outside surface is located at a small radial distance from the perimeter of the substrate support structure surface as well. As a result, edge influences as well as influences related to condensation, which will be discussed later, may be reduced.

Although FIGS. 11A, 11B depict embodiments having a surface provided with a single sacrificial gap, surface designs of the substrate support structure that allow for the development of multiple sacrificial gaps are possible. The creation of more sacrificial gaps, e.g. three equally spaced from each other along the circumference of the outer surface of the clamping layer reduces the capillary flow distance between the position of the retracting surface and the locations along the outer surface of the clamping layer to which liquid is supplied. As a result, the required driving force for inducing a capillary flow for resupplying liquid to the outer surface located on top of the second portion 52 such that the outer surface of the liquid clamping layer maintains its position at these locations may be reduced.

Experiments modeling substrate support structures with a surface that comprises two different height levels have shown that it is beneficial to limit the percentage of the surface portion with a lower height level related to the one or more channels to a surface area that covers less than 25%, preferably less than 20%, of the entire area of the liquid clamping layer. If the one or more channels cover more space, the improved clamping performance caused by the use of a substrate support structure surface with different height levels may decrease.

Figure 13A:
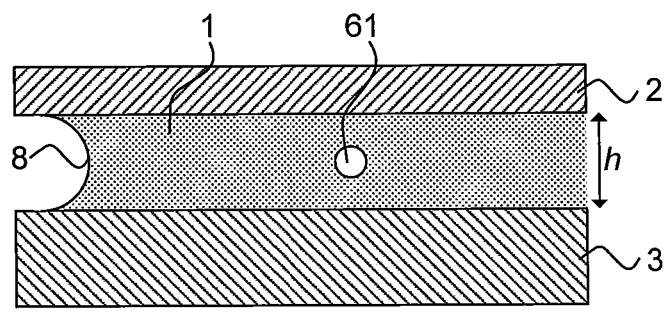
FIGS. 13A, 13B schematically illustrate the concept of void formation and/or cavitation.
Figure 13B:
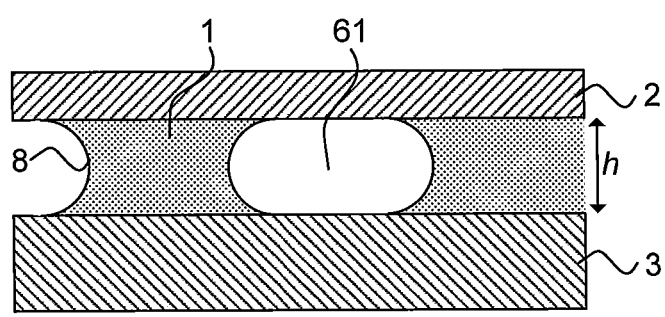

If pre-existing bubbles are present in the clamping liquid used to prepare the liquid clamping layer, introduction of the clamp into a vacuum environment will lead to expansion of such bubbles within the clamping layer as is schematically demonstrated in FIGS. 13A and 13B. The size of an initially small bubble 61 as shown in FIG. 13A can grow by several orders of magnitude as shown in FIG. 13B if ambient pressure decreases, e.g. from 1 bar to 20-40 mbar, a typical value for the vapor pressure in the surroundings of the outer surface of the liquid clamping layer in case the clamping liquid is water. As can be readily seen, a bubble of the size of bubble 61 in FIG. 13B may seriously influence the clamping strength, at least locally, and may have a negative influence on the stability of the clamp.

Another mechanism that may lead to clamp instability is spontaneous void formation, for example caused by liquid cavitation or by dissolved gas precipitation in the clamping layer. Voids formed by cavitation may grow in a similar way as discussed before with respect to pre-existing bubbles if the clamp is brought into a vacuum environment. The resulting voids may have a negative influence on the clamp stability.

Embodiments of the substrate support structure 13 like the one shown in FIG. 2A, may be designed in such a way that cavitation effects are minimized. Without wishing to be bound by theory, it is understood that there is a critical radius for cavities. If the radius of a cavity becomes larger than this critical radius, the cavity may grow extensively. By designing a substrate support structure 13 that enables the formation of a clamping layer with a smallest dimension, i.e. a thickness h, that is smaller than this critical radius, cavitation may be largely limited. Experiments have shown that a clamping layer of water with a maximum thickness h in the order of 3-10 microns does not appear to experience cavitation.

Compartments

Figure 14:
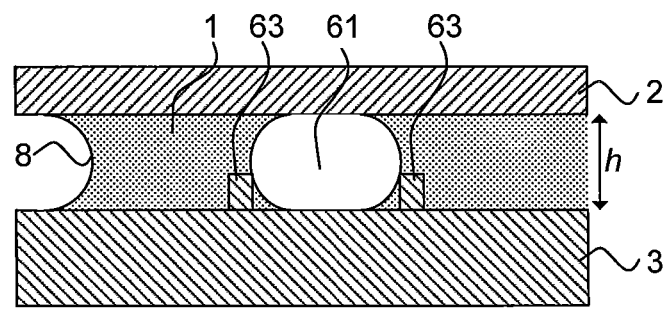
FIG. 14 schematically illustrates the concept of void enclosure.

FIG. 14 schematically illustrates the concept of void enclosure which may be used in some embodiments. In these embodiments, the surface is further provided with elevated structures 63 for forming a plurality of compartments. If a small bubble 61 is present during preparation of the clamping layer, for example a bubble as shown in FIG. 10A, instead of expansion towards a large void due to an ambient pressure decrease as shown in FIG. 10B, the expansion of the bubble 61 may be limited by the elevated structures 63. The maximum size of the expanded bubble is then determined by the size of the compartment enclosing the bubble. Additionally, besides limiting expansion of a bubble 61, the compartment formed by the elevated structures 63 may be arranged to confine the bubble 61. Preventing movement of the bubble may improve the stability of the clamp. With the presence of the elevated structures 63, the influence of spontaneous void development and/or cavitation may thus be further reduced, which may lead to an improved reliability and stability of the clamp.

Figure 15:
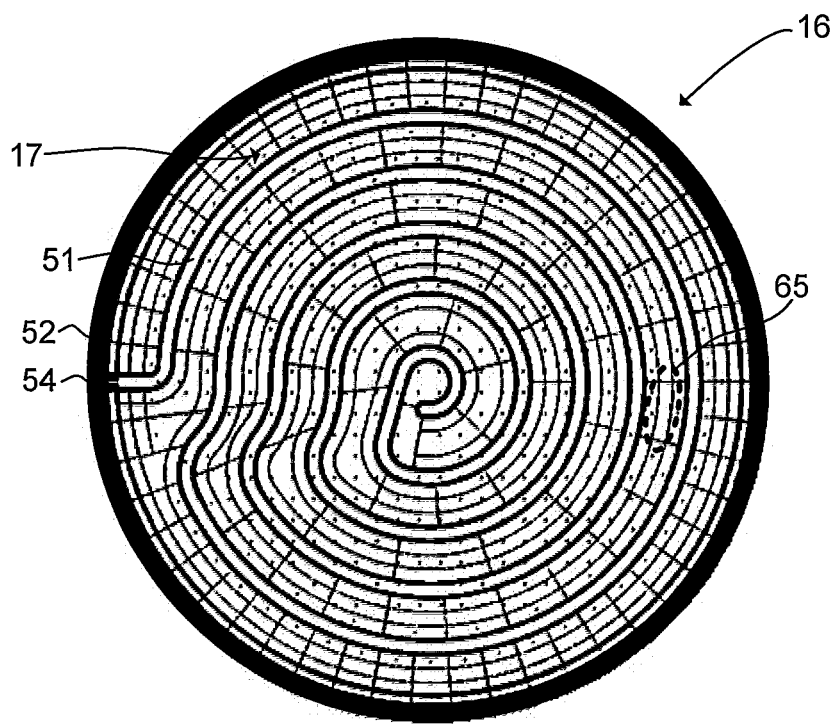
FIG. 15 is a top view of a substrate support structure with compartments.

FIG. 15 is a top view of a substrate support structure according to yet another embodiment of the invention. In this embodiment, similarly to the embodiment shown in FIG. 12, at least a part of the portion 51 with a lower height level takes the form of a channel in a spiral shape. In contrast to the embodiment shown in FIG. 12, the spiral shape is such that the surface portion 51 with a lower height level is homogeneously spread over the substrate support structure surface 16. Furthermore, the surface 16 is provided with elevated structures forming compartments 65 for allowing restriction of bubbles in a way as described with reference to FIG. 14.

Stepped Moat

Figure 16A:
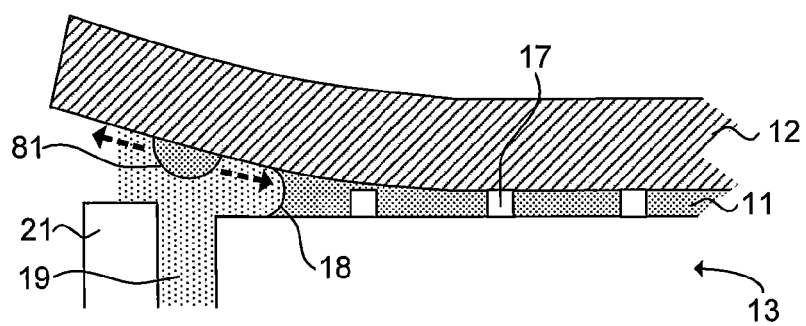
FIG. 16A schematically depicts condensation in a substrate support structure using a liquid clamping layer.

FIG. 16A schematically depicts an effect caused by condensation in a substrate support structure using a liquid clamping layer. Condensation occurs when a vapor is cooled to its dew point. The dew point is dependent on parameters like temperature, volume and pressure. Vapor being present in the region 19 along the moat circumscribing the outer clamping surface 18 may condense on the substrate 12 if the temperature of the substrate 12 is sufficiently cooler than the vapor temperature. A condensation droplet 81 thus formed may move along the substrate surface as schematically depicted with the dashed arrows. If the condensation droplet 81 moves towards the outer surface 18 of the clamping layer 11, the droplet 81 may be absorbed by the clamping layer 11 which will result in an increase of liquid content within the clamping layer. Just as discussed with reference to evaporation, the added liquid will be equally spread throughout the clamping layer.

However, if the clamping layer has an outer surface with a concave surface that is equal at both sides, and the droplet being absorbed is sufficiently large, the equal spreading of liquid may cause the substrate to locally deform temporarily, i.e. a wave may move underneath the substrate and the substrate may react accordingly.

Figure 16B:
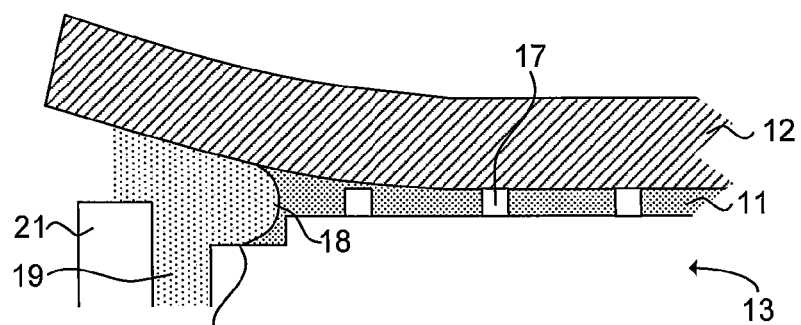
FIG. 16B schematically illustrates a substrate support structure including a moat with a raised portion.

In order to limit such temporary local deformation as a result of absorbing a condensation droplet, the surface 16 of the substrate support structure 13 may be amended in a way as schematically shown in FIG. 16B. The substrate support structure 13 comprises a stepped portion 83 at the circumference of the surface having a slightly lower height. The remainder of the surface may have a single height level as shown in FIG. 16B, but may also have portions with different height levels, for example with contours as shown in and discussed with reference to FIGS. 11A, 11B, 12, 15 and 17A.

Due to the presence of the lower stepped portion 83, upon absorbing the droplet, the outer surface of the clamping layer expands into a region where the layer has a greater thickness. As a result, the flow of liquid caused by absorption of the droplet will be damped. As the meniscus curvature of the clamping layer while covering the lowest stepped portion is reduced in comparison to the meniscus curvature at other locations along the outer surface of the liquid clamping layer, a capillary flow will be induced that allows for retraction of the outer surface towards a position as shown in FIG. 16A. Due to this damping, temporary local deformations of the substrate 12 as discussed with reference to FIG. 16A will be limited.

Experiments have shown that a suitable height difference between the height level of the stepped circumscribing portion 83 and the main clamping surface corresponds to the nominal height of the substrate supporting structures 17. In other words, the height of the substrate supporting structures 17 and depth of the circumscribing portion 83 are preferably equal. The circumscribing portion 83 portion may be used for buffering clamping liquid for any of the embodiments of the substrate support structure.

Serpentine Channel

Figure 17A:
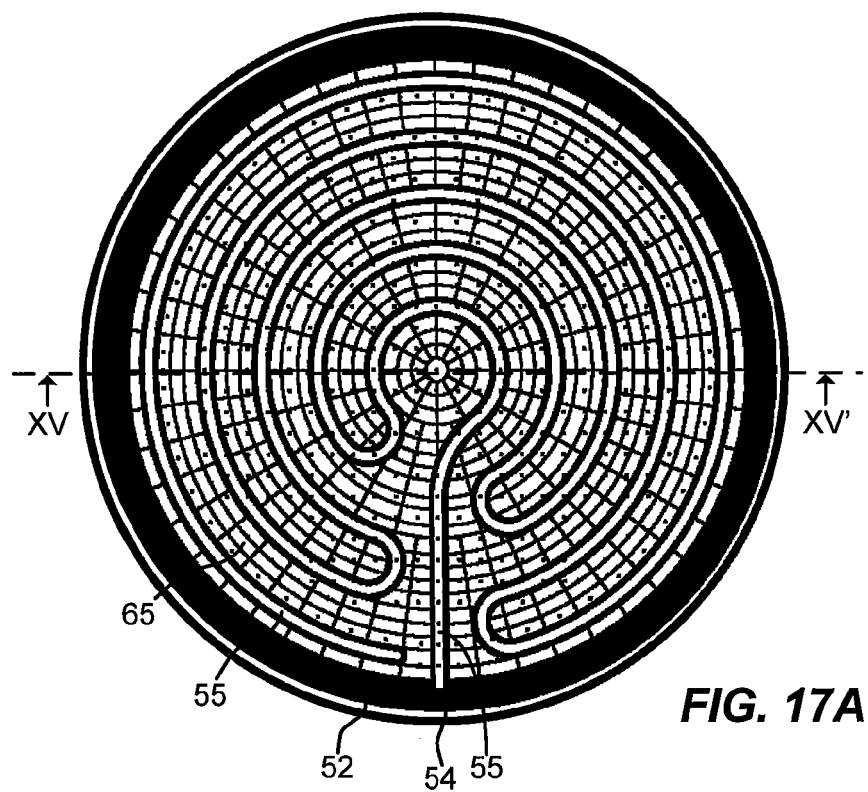
FIG. 17A is a top view of a substrate support structure with a channel in a serpentine form.
Figure 17B:
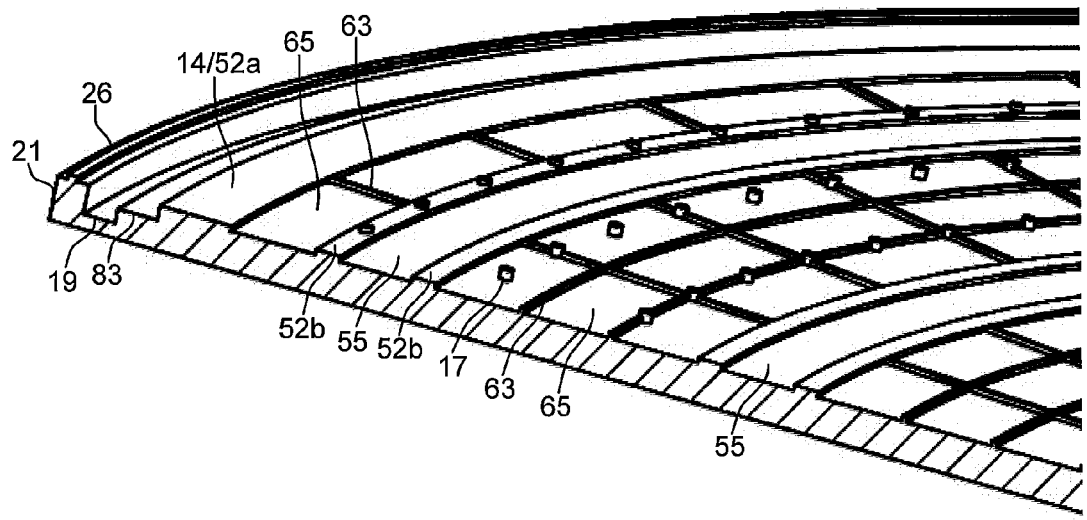
FIG. 17B is a cross-sectional view of a portion of the substrate support structure of FIG. 157.
Figure 17C:
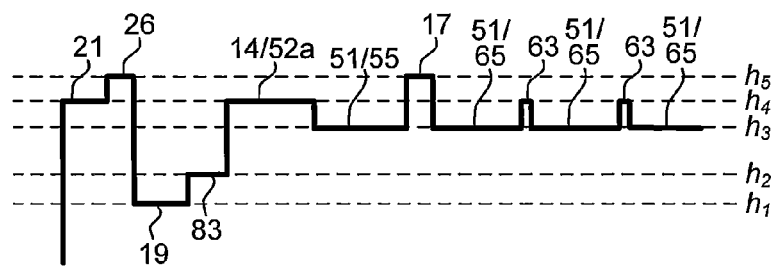
FIG. 17C is a perspective view of a portion of a substrate support structure.

FIG. 17A is a top view of a substrate support structure according to yet another embodiment of the invention. In this embodiment, a number of features already discussed with reference to earlier embodiments are combined. FIG. 17B is a cross-sectional view of a portion of the substrate support structure of FIGS. 17A, and 17C is a cross-sectional view of a portion of a substrate support structure showing a possible height variation for the various elements of the structure.

In the embodiment of FIG. 17A, the surface 16 is provided with a channel 55 formed between higher portions 52. The channel is directed inwards from the sacrificial gap at the perimeter towards the center and is then directed outward from the center towards the perimeter of the substrate support structure. In this embodiment the channel is in a serpentine form. As clamping liquid evaporates from the outer perimeter, liquid is drawn from the channel as described earlier. The channel empties beginning at the sacrificial gap in a direction along the length of the channel, towards the center and then back towards the perimeter. This results in the outermost part of the channel near the perimeter emptying last as evaporation at the outer surface of the clamping liquid layer draws liquid from the channel. By remaining full of liquid for a longer period, the outermost part of the channel can replenish the most critical part of the clamping liquid layer at the perimeter for a longer period, and thus further extend the lifetime of the clamp.

The flow resistance in a clamping liquid layer increases with the distance the liquid flows, while the capillary pressure that overcomes this flow resistance remains the same independent of the flow distance. A serpentine channel form like the one shown in FIG. 17A reduces the distance over which a capillary flow needs to travel to replenish liquid to the outer surface of the clamping liquid layer under conditions when substantial evaporation has occurred and the channel is partially empty. Even after substantial evaporation, the outer portions of the channel still provide a source of liquid for capillary flow close to the outer surface of the clamping liquid layer. In addition, this design avoids having an empty portion of channel near the outer surface of the clamping layer around which liquid must flow to reach the outer surface. Due to the shorter flow distances to replenish the outer surface at the perimeter of the clamping layer, this design is less sensitive to negative influences of flow resistance.

FIG. 17B is a perspective cutaway view of a portion of the design of FIG. 17A showing the various elements discussed above, including a circumferential sealing structure 21 with ridge 26, moat 19 with stepped circumscribing portion 83 used for buffering clamping liquid, a circumferential rim 41 or first (higher) portion 52a at which the outer surface of the clamping liquid layer is formed, compartments 65 with dividing elevated structures 63, first portions 52b bounding the channels 55, and substrate supporting elements 17 for supporting the substrate.

FIG. 17C shows a configuration with one variation of height levels for the various elements. This design comprises at least 5 height levels $h_1$-$h_5$. The first height level that has no real influence on the clamping operation is the height $h_1$ of the bottom of the moat 19. The lowest height of the substrate support structure is the height level $h_2$ of the circumscribing portion 83 used for buffering clamping liquid, for example in case of condensation. Height level $h_3$ in this embodiment is the low height level of the remainder of the surface, which includes the channels 55 and compartments 65. In this embodiment, height level $h_4$ is the height level of the circumferential rim 21 as well as the height level of the higher portions 52 bounding the channel 55, and the elevated structures 63 creating compartments 65 for localizing voids and the like as explained earlier. Finally, height level $h_5$ in this particular embodiment corresponds to the height level of the substrate supporting elements 17 and the sealing structure 21.

Liquid Reservoir

A reservoir of liquid may also be provided for evaporation into the area around the clamping liquid to reduce evaporation from the clamping layer. The substrate support structure 13 shown in FIG. 18A further comprises a liquid reservoir 40. The liquid reservoir 40 is configured to accommodate a certain volume of liquid, for example water, and further to store vapor of that liquid. Furthermore, the liquid reservoir is arranged to provide vapor to the capillary clamping layer 11 when present, for example via one or more channels 43. The reservoir may be referred to as liquid reservoir 40. Preferably, the reservoir liquid in reservoir 40 is the same as the liquid within the clamping layer 11. A suitable liquid for both reservoir liquid and clamping layer is water.

The presence of a liquid reservoir provides a way to further decrease evaporation of liquid from the clamping layer 11, by providing another source of liquid from which vapor is generated. The free surface area of the liquid in the reservoir is preferably larger than the free surface area of the concave outer surface 18 of the clamping layer 11. In the embodiments shown, the reservoir forms a large space extending all the way underneath the surface 16 of the substrate support structure. The reservoir may be more limited in extent, for example in the form of a ring-shaped cavity having its width extending at the inside edge for a small distance under the surface 16. Alternatively, the reservoir may not extend at all under the surface, e.g. being limited to the moat 19 shown in some of the other embodiment.

The amount of vapor in the space adjacent to the outer surface 18 that is contributed by each source of liquid is dependent on the relative size of the free surface area of liquid in the space. A larger free surface area of the liquid stored in the reservoir ensures that a sufficient amount of vapor is available to moisturize the environment of surface 18, resulting in less evaporation from the clamping layer 11.

Figure 18A:
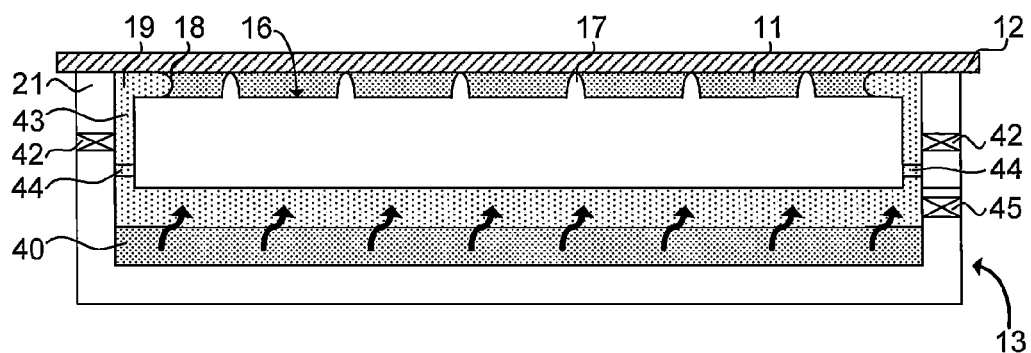
FIG. 18A is a sectional view of a substrate support structure including a reservoir.
Figure 18B:
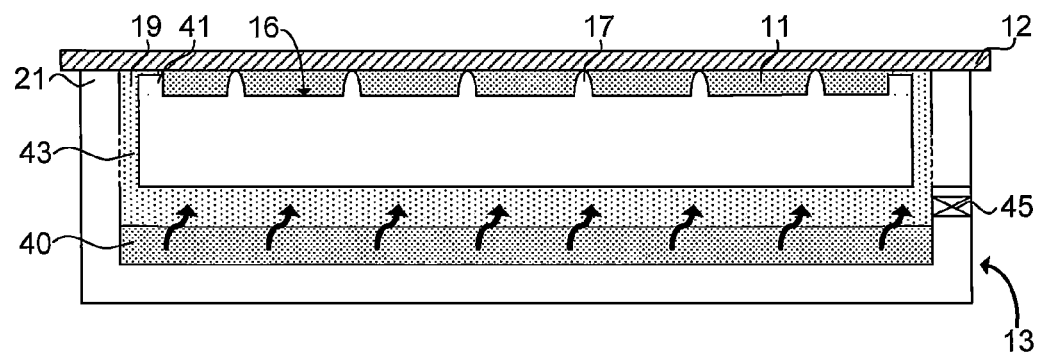
FIG. 18B is a sectional view of a substrate support structure including a reservoir and a circumferential rim.

The liquid may completely fill the reservoir or may partially fill the reservoir leaving a vapor space above the liquid as shown in FIGS. 18A and 18B. The vapor may be transported from the liquid reservoir 40 towards the outer liquid surface 18 of the clamping layer 11 the one or more channels 43. In such a case, the gas for use in the gas distribution system may be provided to the substrate support structure via a valve 45 that is also used to provide liquid to the liquid reservoir 40.

Alternatively, gas may be provided via one or more separate gas connection units. If such gas connection units are configured to provide the gas flow via the one or more channels 43 used to provide vapor to the capillary layer, the one or more channels 43 may be provided with a flow control unit 44 configured to separate gas flow via the gas connection unit from vapor originating from the reservoir 40. In yet another alternative embodiment, the gas distribution system is entirely separate from the one or more elements to provide the vapor from the vapor reservoir 40 to the clamp.

At higher temperatures (e.g. 30 degrees C.), the reservoir may cause condensation problems. This may be alleviated by thermally conditioning the substrate support structure. The reservoir also requires additional preparation steps (e.g. to ensure reservoir is filled) and adds bulk to the substrate support structure. However, the reservoir may be useful for applications in which an extremely long clamp life is required (e.g. a combination of a sealing structure or cantilever seal and a reservoir may be required) or where forming an effective seal may be difficult (e.g. in situations where the bottom surface of the substrate is too rough to permit an adequate seal to ensure sufficient clamp lifetime). A reservoir may also be useful when higher vapor leak rates can be tolerated (e.g. the reservoir can be used instead of a sealing structure) or which operates at lower temperatures (e.g. at 20 C condensation problems may be minimal).

As will be clear from the description above, inducing a capillary flow by using height differences of a substrate supporting structure surface provided with a clamping layer for holding a substrate can be performed for different purposes, for example evaporation control, maintaining the vapor seal against sealing rim, and condensation control. It must be understood that the invention is not limited to these purposes, but may also be applied to provide a solution for other issues related to the stability and reliability of a liquid clamping layer.

Throughout the description, reference has been made to the expression "clamping layer". The expression "clamping layer" should be understood to refer to a thin layer of liquid with a concave meniscus shape having a pressure below the pressure of its surrounding.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A substrate support structure for clamping a substrate on a surface of the substrate support structure by means of a capillary layer of a liquid having an outer liquid surface, the surface of the substrate support structure having an outer edge and comprising one or more substrate supporting elements for receiving the substrate to be clamped,
   wherein the one or more substrate supporting elements are arranged to provide support for the substrate at a plurality of support locations,
   wherein the substrate support structure further comprises a sealing structure circumscribing the surface of the substrate support structure for substantially closing off a circumferential opening facing the outer liquid surface and having a top surface or edge forming a sealing rim,
   wherein a distance between the outer edge of the surface of the substrate support structure and an outermost one of the support locations is greater than a distance between the outer edge and the sealing rim, and
   wherein a distance between the sealing rim and the outermost support location is greater than a maximum distance between adjacent support locations; and
   wherein the sealing rim is substantially level with a top of the substrate supporting elements.

2. The substrate support structure of claim 1, wherein the distance between the outer edge of the surface of the substrate support structure and the outermost support location is greater than or equal to twice the distance between the outer edge and the sealing rim.

3. The substrate support structure of claim 1, wherein the distance between the sealing rim and the outermost support location is greater than or equal to twice the maximum distance between adjacent support locations.

4. The substrate support structure of claim 1, wherein the distance between the outer edge of the surface of the substrate support structure and the outermost support location is greater than or equal to twice the maximum distance between adjacent support locations.

5. The substrate support structure of claim 1, wherein the distance between the outer edge of the surface of the substrate support structure and the outermost support location is equal to or larger than a nominal distance between said supporting locations, and wherein the distance between the outer edge and the sealing rim is equal to or smaller than said nominal distance.

6. The substrate support structure of claim 1, wherein the one or more substrate supporting elements provide support for the substrate at a plurality of said support locations arranged in a regular pattern with a mutual pitch, and the distance between the sealing rim and the support locations nearest to the sealing rim exceeds said pitch.

7. The substrate support structure of claim 1, wherein the surface of the substrate support structure further comprises portions with different capillary potential for inducing, during clamping, a predetermined capillary flow within the liquid capillary layer.

8. The substrate support structure of claim 1, wherein a moat is provided around the surface, the moat comprising a higher stepped portion at the perimeter of the surface.

9. The substrate support structure of claim 8, wherein a height difference between a top surface of the substrate supporting elements and the stepped portion of the moat is greater than or equal to twice the height of the substrate supporting elements.

10. The substrate support structure of claim 1, wherein the surface of the substrate support structure is provided with elevated structures for forming a plurality of compartments.

11. The substrate support structure of claim 1, further comprising a liquid removal system for removing liquid circumferential to said surface.

12. A substrate support structure for clamping a substrate on a surface of the substrate support structure by means of a capillary layer of a liquid having an outer liquid surface, the surface of the substrate support structure having an outer edge and comprising one or more substrate supporting elements for receiving the substrate to be clamped,
   wherein the one or more substrate supporting elements are arranged to provide support for the substrate at a plurality of support locations,
   wherein the substrate support structure further comprises a sealing structure circumscribing the surface of the substrate support structure for substantially closing off a circumferential opening facing the outer liquid surface and having a top surface or edge forming a sealing rim, and
   wherein a distance between the outer edge of the surface of the substrate support structure and an outermost support location is equal to or larger than a nominal distance between said supporting locations, and wherein a distance between the outer edge and the sealing rim is equal to or smaller than said nominal distance.

13. The substrate support structure of claim 12, wherein the one or more substrate supporting elements provide support for the substrate at a plurality of support locations arranged in a regular pattern with a mutual pitch, and a distance between the sealing rim and the support locations nearest to the sealing rim exceeds said pitch.

14. The substrate support structure of claim 12, wherein the sealing rim is substantially level with a top of the substrate supporting elements.

15. The substrate support structure of claim 12, wherein the surface of the substrate support structure further comprises portions with different capillary potential for inducing, during clamping, a predetermined capillary flow within the liquid capillary layer.

16. A combination of a substrate support structure and a substrate clamped on a surface of the substrate support structure by means of a capillary layer of a liquid having an outer liquid surface, the surface of the substrate support structure comprising one or more substrate supporting elements for receiving the substrate and arranged to provide support for the substrate at one or more support locations, wherein the substrate support structure further comprises a sealing structure around the surface of the substrate support structure for substantially closing off a circumferential opening facing the outer liquid surface and having a top surface or edge forming a sealing rim, and wherein a distance between the sealing rim and an outermost one of the support locations is greater than a maximum distance between adjacent support locations.

17. The combination of claim 16, wherein, during clamping of the substrate, the substrate bends downwards to reduce a gap between the sealing rim and a bottom surface of the substrate so that the bottom surface of the substrate touches the sealing rim.

18. The combination of claim 16, wherein the distance between the sealing rim and the outermost support location is greater than or equal to twice the maximum distance between adjacent support locations.

19. The combination of claim 16, wherein the distance between the outer liquid surface of the capillary liquid layer and the outermost support location is greater than the distance between the outer liquid surface of the capillary liquid layer and the sealing rim.

20. The combination of claim 16, wherein the surface of the substrate support structure further comprises portions with different capillary potential for inducing, during clamping, a predetermined capillary flow within the liquid capillary layer.

21. The combination of claim 20, wherein the predetermined capillary flow within the liquid clamping layer is in a direction towards the outer liquid surface of the liquid clamping layer.

* * * * *